(12) United States Patent
Buchholz et al.

(10) Patent No.: US 8,637,853 B2
(45) Date of Patent: Jan. 28, 2014

(54) OPTOELECTRONIC DEVICE

(75) Inventors: Herwig Buchholz, Frankfurt (DE);
Susanne Heun, Bad Soden (DE)

(73) Assignee: Merck Patent GmbH (DE)

( * ) Notice: Subject to any disclaimer, the term of this patent is extended or adjusted under 35 U.S.C. 154(b) by 606 days.

(21) Appl. No.: 12/739,663

(22) PCT Filed: Oct. 24, 2008

(86) PCT No.: PCT/EP2008/009020
§ 371 (c)(1),
(2), (4) Date: Oct. 29, 2010

(87) PCT Pub. No.: WO2009/053088
PCT Pub. Date: Apr. 30, 2009

(65) Prior Publication Data
US 2011/0068329 A1    Mar. 24, 2011

Related U.S. Application Data

(63) Continuation-in-part of application No. 11/923,522, filed on Oct. 24, 2007, now Pat. No. 8,236,902.

(30) Foreign Application Priority Data

Sep. 3, 2008  (DE) .......................... 10 2008 045 662

(51) Int. Cl.
*H01L 35/24* (2006.01)
(52) U.S. Cl.
USPC ..................................... 257/40; 257/E51.001
(58) Field of Classification Search
USPC ........................................... 257/40, E51.001
See application file for complete search history.

(56) References Cited

U.S. PATENT DOCUMENTS

| 2004/0017148 A1 | 1/2004 | Redecker |
| 2005/0029933 A1* | 2/2005 | Liao et al. ..................... 313/504 |
| 2005/0037236 A1* | 2/2005 | Kamatani et al. ............. 428/690 |
| 2005/0162075 A1 | 7/2005 | Madathil |
| 2005/0175861 A1 | 8/2005 | Elschner et al. |
| 2005/0176230 A1 | 8/2005 | Sieber et al. |
| 2006/0076557 A1* | 4/2006 | Waller et al. .................... 257/40 |

(Continued)

FOREIGN PATENT DOCUMENTS

| EP | 0637899 | 2/1995 |
| EP | 0707020 | 4/1996 |

(Continued)

OTHER PUBLICATIONS

Patent Abstract of JP2003-257677, Publication Date Dec. 9, 2003.

(Continued)

*Primary Examiner* — Anthony Ho
(74) *Attorney, Agent, or Firm* — Novak Druce Connolly Bove + Quigg LLP

(57) ABSTRACT

The present invention relates to an opto-electronic device comprising a first layer and a second layer on a substrate, characterized in that the first layer comprises an electrode material containing fluorine-containing groups and the second layer comprises a polymer containing fluorine-containing groups, where an adhesive fluorine-fluorine interaction exists between some of the fluorine-containing groups of the first layer and of the second layer. The invention furthermore relates to the use of the opto-electronic device and to a process for the production of the opto-electronic device according to the invention.

29 Claims, 3 Drawing Sheets

(56) References Cited

U.S. PATENT DOCUMENTS

Figure 1:
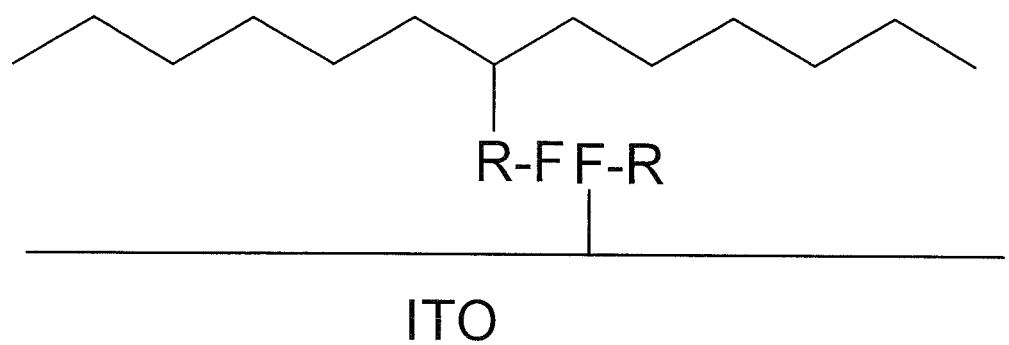

| | | |
|---|---|---|
| 2007/0126347 A1 | 6/2007 | Jarikov |
| 2007/0169815 A1* | 7/2007 | Kim et al. .................... 136/263 |
| 2011/0065222 A1 | 3/2011 | Meyer et al. |

FOREIGN PATENT DOCUMENTS

| | | |
|---|---|---|
| EP | 0842206 | 2/1997 |
| EP | 0894107 | 10/1997 |
| EP | 1239526 | 9/2002 |
| EP | 1339112 A2 | 8/2003 |
| EP | 1647566 A2 | 4/2006 |
| EP | 1811533 A2 | 7/2007 |
| WO | WO-90/13148 A1 | 11/1990 |
| WO | WO-94/05045 | 3/1994 |
| WO | WO-95/31833 | 11/1995 |
| WO | WO-97/05184 | 2/1997 |
| WO | WO-97/39045 | 10/1997 |
| WO | WO-98/03566 | 1/1998 |
| WO | WO-98/48433 | 10/1998 |
| WO | WO-99/10939 | 3/1999 |
| WO | WO-99/54385 | 10/1999 |
| WO | WO-00/22026 | 4/2000 |
| WO | WO-00/22027 | 4/2000 |
| WO | WO-00/46321 | 8/2000 |
| WO | WO-02/068435 | 9/2002 |
| WO | WO-02/072714 | 9/2002 |
| WO | WO-03/019694 | 3/2003 |
| WO | WO-03/020790 | 3/2003 |
| WO | WO-03/048225 | 6/2003 |
| WO | WO-2004/026886 | 4/2004 |
| WO | WO-2004/037887 | 5/2004 |
| WO | WO-2004/070772 | 8/2004 |
| WO | WO-2004/113468 | 12/2004 |
| WO | WO-2005/004251 A1 | 1/2005 |
| WO | WO-2005/014688 | 2/2005 |
| WO | WO-2005/014689 | 2/2005 |
| WO | WO-2005/017065 | 2/2005 |
| WO | WO-2005/040302 | 6/2005 |
| WO | WO-2005/042548 | 6/2005 |
| WO | WO-2007093282 A1 | 8/2007 |

OTHER PUBLICATIONS

Patent Abstract of JP2005-232452, Publication Date Feb. 9, 2005.

\* cited by examiner

Polymer P1 on the layer structure from Example 1:

Comparative polymer C1 on the layer structure from Example 1:

Comparative polymer C2 on the layer structure from Example 1:

OPTOELECTRONIC DEVICE

CROSS REFERENCE TO RELATED APPLICATIONS

This application is a national stage application under 35 U.S.C. §371 of PCT/EP2008/009020 filed Oct. 24, 2008, which claims benefit to German application 102008045662.4, filed Sep. 3, 2008, and which claims priority under 35 U.S.C. §119 (a)-(d) to U.S. patent application Ser. No. 11/923,522, filed Oct. 24, 2007, the entire disclosures of which are hereby incorporated by reference.

The present invention relates to an opto-electronic device comprising a first layer and a second layer on a substrate, characterised in that the first layer comprises an electrode material containing fluorine-containing groups and the second layer comprises a polymer containing fluorine-containing groups, where an adhesive fluorine-fluorine interaction exists between some of the fluorine-containing groups of the first layer and of the second layer. The invention furthermore relates to the use of the opto-electronic device and to a process for the production of the opto-electronic device according to the invention.

Electronic devices which comprise organic, organometallic and/or polymeric semiconductors are being used ever more frequently in commercial products or are just about to be introduced onto the market. Examples which may be mentioned here are charge-transport materials on an organic basis (for example hole transporters based on triarylamine) in photocopiers and organic or polymeric light-emitting diodes (OLEDs or PLEDs) in display devices or organic photoreceptors in copiers. Organic solar cells (O-SCs), organic field-effect transistors (O-FETs), organic thinfilm transistors (O-TFTs), organic integrated circuits (O-ICs), organic optical amplifiers and organic laser diodes (O-lasers) are in an advanced stage of development and may achieve major importance in the future.

Many of these electronic or opto-electronic devices have, irrespective of the respective application, the following general layer structure, which can be adapted for the respective application:
(1) substrate,
(2) electrode, which is frequently metallic or inorganic, but may also be built up from organic or polymeric conductive materials,
(3) optionally one or more charge-injection layers or buffer layers for compensation of the unevenness of the electrode, which is (are) frequently formed from one or more conductive, doped polymer(s),
(4) at least one layer of an organic semiconductor,
(5) optionally one or more further charge-transport or charge-injection or charge-blocking layer(s),
(6) counterelectrode, in which the materials mentioned under (2) are employed,
(7) encapsulation.

The present invention is directed in particular, but not exclusively, to organic light-emitting diodes (OLEDs), which, on use of polymeric materials, are frequently also known as polymeric light-emitting diodes (PLEDs). The above arrangement represents the general structure of an opto-electronic device, where various layers may be combined, meaning that in the simplest case an arrangement consists of two electrodes, between which an organic layer is located. The organic semiconductor layer in this case fulfils all functions, including the emission of light. A system of this type is described, for example, in WO 90/13148 A1 on the basis of poly(p-phenylenes).

A problem which arises in a "three-layer system" of this type is, however, the lack of control of charge separation or the lack of a possibility of optimising the individual constituents in different layers with respect to their properties, as has been solved in a simple manner, for example, in the case of SMOLEDs ("small-molecule OLEDs") through a multilayered structure. A "small-molecule OLED" consists, for example, of one or more organic hole-injection layers, hole-transport layers, emission layers, electron-transport layers and electron-injection layers and an anode and a cathode, where the entire system is usually located on a glass substrate. An advantage of a multilayered structure of this type consists in that various functions of charge injection, charge transport and emission can be divided into the different layers and the properties of the respective layers can thus be modified separately.

Typical hole-transport materials in SMOLEDs are, for example, di- and triarylamines, thiophenes, furans or carbazoles, as also investigated and used in photoconductor applications.

Metal chelates, conjugated aromatic hydrocarbons, oxadiazoles, imidazoles, triazines, pyrimidines, pyrazines, pyridazines, phenanthrolines, ketones or phosphine oxides are usually used for the emission and electron-transport layers in SMOLEDs.

The compounds which are used in an SMOLED can frequently be purified by sublimation and are thus available in purities of greater than 99 percent.

The layers in SMOLED devices are usually applied by vapour deposition in a vacuum chamber. However, this process is complex and thus expensive and is unsuitable, in particular, for large molecules, such as, for example, polymers.

Polymeric OLED materials are therefore usually applied by coating from solution. However, the production of a multilayered organic structure by coating from solution requires that the solvent is incompatible with the respective preceding layer in order not to partially dissolve, swell or even destroy the latter again. However, the choice of solvent proves to be difficult, since the organic compounds employed usually have similar properties, in particular similar solution properties. Application of further layers from solution thus becomes virtually impossible or is at least made significantly more difficult. Even the application of a first polymer layer to, for example, an indium tin oxide layer usually already causes problems since adequate adhesion of the polymer layer to the ITO cannot be guaranteed. For this reason, ITO substrates are usually subjected to complex cleaning and are surface-activated using a UV/ozone plasma in order to ensure better adhesion to and better contact with the subsequent organic layers. The first organic layer applied here is usually the so-called buffer layer, which is deposited from an aqueous dispersion (for example Clevios P AI 4083 from H. C. Starck). The layer of PEDOT/PSS obtained compensates for unevenness of the ITO layer and ensures good hole injection into the subsequent organic layers. Without the pretreatment of the ITO, however, the PEDOT layer would not adhere, and direct deposition of low-polarity organic layers onto ITO from solution is totally impossible. On application of further layers from solution, the first polymer layer on the ITO is partially dissolved again or even washed off and thereby destroyed.

Correspondingly, polymeric OLEDs in accordance with the prior art are usually built up on the anode side only from a single-layered or at most two-layered organic structure, where the PEDOT is either followed directly by the emitting polymer or by an interlayer used for hole injection and hole transport. However, a multilayered structure as in the case of SMOLEDs would also be advantageous in the case of polymeric OLEDs, various approaches having been attempted in the prior art.

Thus, for example, EP 0 637 899 A1 discloses an electroluminescent arrangement comprising one or more organic layers, where one or more of the layers is (are) obtained by thermal or radiation-induced crosslinking. A problem in the case of thermal crosslinking is that the polymeric layers are subjected to a relatively high temperature, which in some cases again results in destruction of the corresponding layer or in the formation of undesired by-products. In the case of crosslinking with actinic radiation, it is frequently necessary to use molecules or moieties which are able to initiate free-radical, cationic or anionic polymerisation. However, it is known in the prior art that molecules or moieties of this type can have adverse effects on the functioning of an opto-electronic device. The use of high-energy actinic radiation is also problematical.

The object of the present invention was thus to provide an opto-electronic device which comprises a plurality of specialised functional layers which can be deposited from solution or dispersion, in each case adhere well to one another, i.e. ensure good contact, and also cannot be dissolved again by a subsequent coating step.

The object is achieved by an opto-electronic device comprising a first layer and a second layer on a substrate, characterised in that the first layer comprises an electrode material containing fluorine-containing groups and the second layer comprises a polymer containing fluorine-containing groups, where an adhesive fluorine-fluorine interaction exists between some of the fluorine-containing groups of the first layer and of the second layer.

In an embodiment of the invention, it is preferred for the electrode to be an indium tin oxide (ITO) layer or an indium zinc oxide (IZO) layer. In this case, the second layer preferably comprises a conductive polymer.

In a further embodiment of the invention, it is preferred for the electrode to be a highly conductive polymer or to consist of an ITO or IZO layer and a conductive polymer. In this case, the second layer comprises a hole-injection function and/or an emitter function. The conductive polymers used for hole injection and transport in all embodiments are preferably polymers rendered conductive by doping (oxidatively or by means of acids). PEDOT doped with polystyrenesulfonic acid (PSS) is available, for example, from H. C. Starck as Clevios P A14083 A, and PANI doped with PSS is available as PAT 020 from Merck KGaA. However, all other known buffer materials can also be employed in the said embodiment.

In a further preferred embodiment of the invention, the opto-electronic device comprises an additional layer (or a plurality of additional layers). The additional layer advantageously also comprises compounds containing fluorine-containing groups. The additional layer may comprise a polymer containing fluorinated groups, a partially fluorinated polymer or a polymer containing fluorinated or perfluorinated side groups, an oligomer containing fluorinated groups or a fluorinated molecule. An adhesive fluorine-fluorine interaction thus exists between some of the fluorine-containing groups of the components of the additional layer and of the respective preceding layer.

The additional layer is preferably a charge-injection layer, an emitter layer, a barrier layer and/or a combination thereof.

In a further preferred embodiment of the invention, it is preferred for the polymer of the further layer to have at least one emitter function. In particular, the polymer having an emitter function should emit light of various wavelengths. This can be achieved by different emitters being present in one or more polymers or a blend in the layer.

In addition, it is preferred for the device to comprise a plurality of layers of polymers having an emitter function. It is particularly preferred here for the plurality of layers of polymers having an emitter function each to emit light of different wavelength.

In a particularly preferred embodiment, it is furthermore preferred for the various wavelengths to add up to the colour white.

A preferred embodiment of the invention comprises, for example, a multilayered arrangement for a white-light emitter, comprising an interlayer and a blue polymer layer, both of which adhere via F—F interactions, and a yellow-emitting layer, whose contact can likewise be increased by fluorine-fluorine interactions. The yellow triplet emitter can be a true yellow emitter or an emitter which is composed of a red emitter and a green emitter. The use of stable triplet emitters of high efficiency enables a white light-emitting system of high efficiency and long lifetime to be obtained. This system is, in addition, distinguished by a simple production method (vacuum vapour deposition unnecessary) and thus lower costs.

In still a further embodiment of the invention, the device may comprise a plurality of layers of polymers having a hole-conductor function, where the hole conductors have energetically different highest occupied molecular orbitals (HOMO).

It is particularly preferred here for the polymer layer having a hole-conductor function which was applied last to have an energetically high lowest unoccupied molecular orbital (LUMO). In this way, the polymer layer which was applied last is an electron-blocking layer.

In still a further embodiment of the invention, the device may comprise a plurality of layers of polymers having an electron-conductor function, where the electron conductors have energetically different lowest unoccupied molecular orbitals (LUMO).

It is particularly preferred here for the polymer layer having an electron-conductor function which was applied first to have an energetically low highest occupied molecular orbital (HOMO). In this way, the polymer layer which was applied first is a hole-blocking layer.

A preferred embodiment thus comprises a multilayered arrangement comprising a plurality of (partially) fluorinated polymeric hole conductors and/or electron conductors having different HOMO and LUMO energies and a corresponding electron- or hole-blocking function. This enables improved hole or electron injection to be achieved owing to graduated barrier steps and enables charge recombination to be achieved efficiently in the emission layer. The functions of charge transport and blocking here are enhanced by the good adhesion of the fluorinated layers to one another and the resultant good contact.

The opto-electronic device according to the invention furthermore comprises a cathode and preferably an encapsulation.

The object according to the invention is also achieved by a process for the production of an opto-electronic device, comprising
 a) application of a first layer to a substrate, and
 b) application of a second layer,
where the first layer is an electrode which is provided with fluorine-containing groups before, during or after application to the substrate.

In a preferred embodiment, the electrode used is indium tin oxide (ITO) or indium zinc oxide (IZO). In this case, the fluorine-containing groups are preferably applied to the electrode via a surface reaction or $CF_4$ plasma treatment after application of the electrode to the substrate.

In a further preferred embodiment, the electrode is a conductive polymer, and the fluorine-containing groups are preferably introduced into the conductive polymer before application of the electrode to the substrate. This can be carried out by chemical modification of the polymer itself (fluorination reactions on the polymer), through the use of fluorinated monomers in the polymer synthesis or through the use of (partially) fluorinated dopants (such as, for example, polystyrenesulfonic acid, available as Liquion Solution LQ 1115, 110 EW). However, a plasma treatment carried out after deposition of the layer is likewise possible. Particular preference is given to the use of an electrode which consists of a combination of ITO or IZO with a conductive polymer, where the contact is in turn enhanced by a $CF_4$ plasma treatment of ITO or IZO and fluorine-containing groups in the conductive polymer.

For the second layer, a partially fluorinated polymer, a polymer containing perfluorinated side groups, an oligomer containing fluorinated groups or a fluorinated molecule is preferably used. It is furthermore preferred for the second layer to have a charge-injection function, an emitter function, a barrier function or combinations of the said functions.

One or more additional layers are preferably applied to the applied layer. The additional layer (or the additional layers) preferably comprises (comprise) a charge-injection function (hole- or electron-injection function), an emitter function, a barrier function or combinations of the said functions.

It may furthermore be advantageous in accordance with the invention for the device to comprise a layer (or a plurality of layers) comprising small molecules or oligomers. This is preferably applied as the final layer (before a cathode). The layer can be applied by coating from solution, by printing processes, by vapour deposition or by other methods known from the prior art.

For the purposes of this invention, it is preferred for an adhesive fluorine-fluorine interaction to exist between some of the fluorine-containing groups of the first layer and of the respective further layers.

It is furthermore preferred for a cathode and an encapsulation to be applied to the opto-electronic device.

"Some" of the fluorine-containing groups means that about 10 to 100%, preferably 50 to 100% and particularly preferably 90% to 100%, of the fluorine-containing groups undergo an interaction. In order to undergo an interaction with one another, the separation of the fluorine atoms may, for example correspond approximately to the van der Waals radius. The separation of the fluorine atoms to one another is at least such that an attractive F—F interaction occurs, comparable with the interaction in the case of hydrogen bonds. In relation to the interaction of the layers with one another, the number of fluorine groups of the layer deposited from solution should as far as possible match the degree of fluorination of the surface already present. The proportion of interacting groups here should be sufficiently high that each fluorine-carrying group of the layer deposited in the 2nd step finds a pendant on the previously deposited (or plasma-modified) layer. A polymer in a layer according to the invention preferably comprises 0.5 to 100%, particularly preferably 1 to 50% and in particular 1 to 25%, of fluorine-containing groups, based on the recurring units of the polymer. 100% here means that every recurring unit of the polymer contains fluorine-containing groups.

For the purposes of the present invention, the fluorine-containing groups $R_f$ preferably have the general formula $C_xH_yF_z$, where $x \geq 0$, $y \geq 0$ and $z \geq 1$, and no, one or more $CH_2$ groups, which may also be adjacent, may be replaced by O, S, Se, Te, $Si(R^1)_2$, $Ge(R^1)_2$, $NR^1$, $PR^1$, CO, $P(R^1)O$, where $R^1$ is on each occurrence, identically or differently, a straight-chain, branched or cyclic alkyl, alkenyl, alkynyl, aryl, arylalkyl, arylalkenyl, arylalkynyl, heteroaryl or heteroalkyl group, where, in addition, one or more non-adjacent C atoms of the non-aromatic moieties may be replaced by O, S, CO, COO or OCO, with the proviso that two radicals $R^1$ may also form ring systems with one another. Preferred groups include, for example, F, $CF_3$, $C_2F_5$, $CF_3(CH_2)_aS$, $CF_3CF_2S$ and $(CF_3-(CH_2)_a)_2N$, where a preferably represents an integer from 0 to 5.

Surprisingly, it has been found that, after application of a fluorinated polymer or a polymer containing fluorinated or perfluorinated side groups from solution to fluorinated or fluorine-containing surfaces, the polymer can no longer be dissolved, washed off or washed away and also does not swell after removal of the solvent. It was thus possible to fix the layer without the use of high temperatures and without the use of high-energy radiation. It is thus possible to apply a further layer from solution without problems without damaging the structure of the preceding layer. Surprisingly, it has, in addition, been found that the same effect arises on application of a plurality of fluorinated polymers (or fluorinated oligomers or fluorinated small molecules). The fluorine-fluorine interaction of the layers with one another causes strong adhesion, which ensures particularly good contact between the layers and thus makes multilayered devices possible, as are known from "small-molecule OLEDs".

Preferred materials for the substrate are, for example, glasses and films which guarantee adequate mechanical stability and barrier action.

The first layer is preferably located on the substrate, and usually serves as electrode. Indium tin oxide (ITO) or indium zinc oxide (IZO) is particularly preferably applied to the substrate, which is usually carried out by sputtering. The fluorination is carried out subsequently, for example by $CF_4$ plasma treatment.

It is likewise possible for a conductive polymer to be applied to the substrate, for example by coating from solution. The conductive polymer is preferably selected from PEDOT and PANI. In a particularly preferred embodiment, the conductive polymer is a polymer which preferably carries fluorine-containing groups, for example fluorinated PEDOT or PANI. The polymer is preferably doped and can thus function as charge-injection layer. The polymer is preferably a polythiophene derivative, particularly preferably poly(3,4-ethylenedioxy-2,5-thiophene) (PEDOT) or polyaniline (PANI). The polymers are preferably doped with polystyrenesulfonic acid or another polymer-bound Brönsted acids and thus converted into a conductive state. In accordance with the invention, the conductive polymer preferably contains fluorine-containing groups $R_f$ (for example as defined above).

PEDOT is commercially available, for example from H. C. Starck. It is usually in polystyrenesulfonic acid-doped form as PEDOT:PSS. PEDOT is a conjugated polymer and can carry positive charges. Thus, like PANI, it is a transparent polymer and is therefore highly suitable as component in an opto-electronic device. The introduction of fluorine-containing groups into PEDOT is advantageously carried out during preparation of the polymer, where fluorinated monomers can be employed and correspondingly copolymerised. It is likewise possible to employ fluorinated or partially fluorinated polystyrenesulfonic acid (or derivatives and copolymers thereof). It is likewise possible, as also in the case of PANI, to fluorinate an applied polymer layer, for example by $CF_4$ plasma treatment.

Polyaniline is a conjugated polymer which consists of aniline monomers coupled to one another oxidatively and with acid catalysis. Polyaniline is in doped form directly after the synthesis (emeraldine salt, ES). In the case of acid-catalysed polymerisation, the dopant is the acid anion, the base form is present in a basic medium (emeraldine base, EB). Undoped PANI appears blue, doped PANI appears green and the reduced forms appear yellowish. Modifications can be achieved specifically by doping by means of introduction or removal of anions having different chemical-physical properties.

In order to obtain a polyaniline containing fluorine-containing groups which is desired in accordance with the invention, aniline can be copolymerised together with aniline derivatives, for example by employing aniline monomers with substituents containing fluorine-containing radicals $R_f$ (for example as defined above), for example 2-trifluoromethylaniline or similar compounds. However, the dopant here (PSS) may also carry the (partially) fluorinated groups.

In principle, however, all known buffer layers can be employed for the purposes of the invention and modified by introduction of fluorine groups.

If the first layer is an ITO or IZO layer, a conductive polymer is preferably present in the second layer. It is likewise possible for the second layer to consist of the conductive polymer itself.

It is furthermore preferred for the second layer to include a hole-injection function and in addition it is preferred for the second layer to include a hole-transport function. Both functions can be provided, for example, by doped polythiophene derivatives or polyanilines.

For the purposes of this invention, the second layer may likewise preferably include an emitter function. This can be carried out, for example, by copolymerisation of emitter compounds or photoluminescent compounds with the monomers of the corresponding (conductive) polymer. The emitter compounds or photoluminescent compounds may be located in the main chain or side chain of the conductive polymer or may, for example, be grafted to suitable sites. It is likewise possible to employ monomeric or polymeric emitter compounds, which preferably contain fluorine-containing groups.

The opto-electronic device according to the invention preferably comprises an additional layer. It is likewise preferred for further additional layers to be present in the device besides the one additional layer. For the purposes of this invention, it is preferred for the additional layer (or the additional layers) to comprise compounds containing fluorine-containing groups, preferably as defined above. The at least one additional layer may thus also comprise a polymer containing fluorinated groups, a partially fluorinated polymer or a polymer containing fluorinated or perfluorinated side groups, an oligomer containing fluorinated groups or a fluorinated molecule (small molecule).

In accordance with the invention, the opto-electronic device is distinguished by the fact that an adhesive fluorine-fluorine interaction exists between some of the fluorine-containing groups of the additional layer and of the respective preceding layer. For the purposes of this invention, the additional layer can be a charge-injection layer (hole- or electron-injection layer), a charge-transport layer (hole- or electron-transport layer), an emitter layer, a hole- or electron-blocking layer and/or a combination thereof. This in turn means that the additional layer may combine a plurality of functions in one layer, or that a plurality of additional layers take on the corresponding functions.

A classical structure comprising substrate, electrode, multifunction layer and cathode or a structure as in the case of a small-molecule OLED, namely a structure comprising
1) substrate,
2) electrode or anode,
3) hole-injection layer(s),
4) hole-transport layer(s),
5) emission layer(s),
6) electron-transport layer(s),
7) electron-injection layer(s) and
8) counterelectrode or cathode,
is thus possible in accordance with the invention.

In accordance with the invention, one or more of the layers may be combined with one another, or the structure comprising polymeric layers may be combined with layers as are known from an SMOLED. For example, components can be applied by vapour deposition or printing, if desired, or components can be applied from solution, where the components preferably contain fluorine-containing groups.

For the purposes of the present invention, the opto-electronic device is suitable as organic or polymeric light-emitting diode, as organic solar cell (O-SC, for example WO 98/48433, WO 94/05045), as organic field-effect transistor (O-FET), as organic integrated circuit (O-IC, for example WO 95/31833, WO 99/10939), as organic field-quench element (FDQ, for example US 2004/017148), as organic optical amplifier, as organic photoreceptor, as organic photodiode or as organic laser diode (O-LASER, for example WO 98/03566), and can be used correspondingly thereto.

For use in O-FETs, materials having high charge-carrier mobility are of particular interest. These are, for example, oligo- or poly(triarylamines), oligo- or poly(thiophenes) and copolymers which contain a high proportion of these units.

The device is structured correspondingly (depending on the application), provided with contacts and finally hermetically sealed, since the lifetime of devices of this type is drastically shortened in the presence of water and/or air. It may also be preferred here to use a conductive, doped polymer as electrode material for one or both of the electrodes and not to introduce an interlayer comprising conductive, doped polymer.

For applications in O-FETs and O-TFTs, it is additionally necessary for the structure to comprise, apart from electrode and counterelectrode (source and drain), a further electrode (gate), which is isolated from the organic semiconductor by an insulator layer having a generally high (or rarely low) dielectric constant. In addition, it may be appropriate to introduce further layers into the device.

For the purposes of this invention, the electrodes are selected in such a way that their potential corresponds as well as possible to the potential of the adjacent organic layer in order to ensure the most efficient electron or hole injection possible.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, Li$_2$O, BaF$_2$, MgO, NaF, etc.). The layer thickness of this layer is preferably between 1 and 10 nm.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiO$_x$, Al/PtO$_x$) may also be preferred. For some applications, at least one of the electrodes must be transparent in order either to enable irradiation of the organic material (O-SCs) or the coupling-out of light (OLEDs/PLEDs, O-lasers). A preferred structure uses a transparent anode. Preferred anode materials here are conductive mixed metal oxides. Particular preference is given to indium tin oxide (ITO) or indium zinc oxide (IZO) containing fluorine-containing groups. Preference is furthermore given to conductive, doped organic materials, in particular conductive doped polymers, which preferably contain fluorine-containing groups, as defined above.

Suitable as hole-injection layer on the anode are various doped, conductive polymers. Preference is given to polymers which have a conductivity >10$^{-8}$ S/cm, depending on the application. The potential of the layer is preferably 4 to 6 eV vs. vacuum. The layer thickness is preferably between 10 and 500 nm, particularly preferably between 20 and 250 nm. Particular preference is given to the use of derivatives of polythiophene (in particular poly(3,4-ethylenedioxy-2,5-thiophene) (PEDOT) and polyaniline (PANI)). Further preferred (intrinsically) conductive polymers are polythiophene (PTh), poly(3,4-ethylenedioxythiophene) (PEDOT), polydiacetylene, polyacetylene (PAc), polypyrrole (PPy), polyisothianaphthene (PITN), polyheteroarylenevinylene (PArV), where the heteroarylene group can be, for example, thiophene, furan or pyrrole, poly-p-phenylene (PpP), polyphenylene sulfide (PPS), polyperinaphthalene (PPN), polyphthalocyanine (PPc) inter alia, and derivatives thereof (which are formed, for example, from monomers substituted by side chains or groups), copolymers thereof and physical mixtures thereof. The doping is generally carried out by means of acids or by means of oxidants. The doping is preferably carried out by means of polymer-bound Brönsted acids. Particular preference is given for this purpose to polymer-bound sulfonic acids, in particular poly(styrenesulfonic acid) and poly(vinylsulfonic acid). The conductive polymer for the charge-injection layer preferably contains fluorine-containing groups, causing fixing of the layer through adhesive F—F interactions to take place after application from solution and removal of the solvent.

Besides emitting recurring units, the polymer of the emitter layer preferably contains further recurring units, which likewise preferably contain fluorine-containing groups or substituents. This may be a single polymeric compound or a blend of two or more polymeric compounds or a blend of one or more polymeric compounds with one or more low-molecular-weight organic compounds. The organic emitter layer can preferably be applied by coating from solution or by various printing processes, in particular by ink-jet printing processes. The polymeric compound and/or the further compounds preferably contain fluorine-containing groups. The layer thickness of the organic semiconductor is preferably 10 to 500 nm, particularly preferably 20 to 250 nm and in particular 30 to 120 nm, depending on the application.

Preferred recurring units in the polymer of the emitter layer are, for example, the compounds shown below, without being restricted thereto:

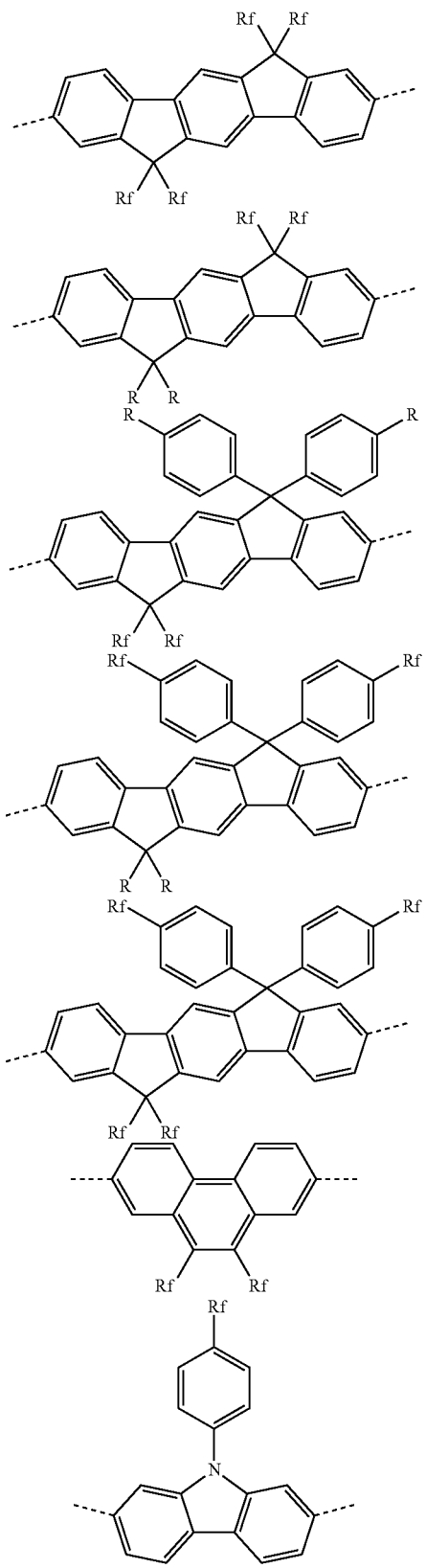

In these formulae, R$_f$ denotes a fluorinated radical of the general formula C$_x$H$_y$F$_z$, where x≥0, y≥0 and z≥1, and no, one or more CH$_2$ groups, which may also be adjacent, may be replaced by O, S, Se, Te, Si(R$^1$)$_2$, Ge(R$^1$)$_2$, NR$^1$, PR$^1$, CO, P(R$^1$)O, where R$^1$ and R are on each occurrence, identically or differently, a straight-chain, branched or cyclic alkyl, alkenyl, alkynyl, aryl, arylalkyl, arylalkenyl, arylalkynyl, heteroaryl or heteroalkyl group, where, in addition, one or more non-adjacent C atoms of the non-aromatic moieties may be replaced by O, S, CO, COO or OCO, with the proviso that two radicals R$^1$ may also form ring systems with one another. Preferred groups include, for example, F, CF$_3$, C$_2$F$_5$, CF$_3$(CH$_2$)$_a$S, CF$_3$CF$_2$S and (CF$_3$—(CH$_2$)$_a$)$_2$N, where a preferably represents an integer from 0 to 5.

Preferred polymers or fluorine-containing polymers (or polymers containing fluorinated or perfluorinated side groups) for the purposes of this invention are conjugated polymers or partially conjugated polymers which contain sp$^2$-hybridised carbon atoms in the main chain, which may also be replaced by corresponding heteroatoms. Furthermore, the term conjugated is likewise used for the purposes of this invention if, for example, arylamine units and/or certain heterocycles (i.e. conjugation via N, O or S atoms) and/or organometallic complexes (i.e. conjugation via the metal atom) are located in the main chain. Typical representatives of conjugated polymers as can be used, for example, in PLEDs or generally in O-SCs are poly-para-phenylenevinylenes (PPVs), polyfluorenes, polyspirobifluorenes, polyphenanthrenes, polydihydrophenanthrenes, polyindenofluorenes, systems based in the broadest sense on poly-p-phenylenes (PPPs), and derivatives of these structures, in particular derivatives which contain fluorine-containing groups.

Particular preference is given in accordance with the invention to polymers which contain further structural elements and should thus be referred to as copolymers. Reference should also be made here, in particular, to the relatively extensive lists of possible structural elements in WO 02/077060, WO 2005/014689 and the references cited in these specifications. These further structural units can originate, for example, from the classes described below:

Group 1: structural units which represent the polymer backbone.
Group 2: structural units which enhance the hole-injection and/or -transport properties of the polymers.
Group 3: structural units which enhance the electron-injection and/or -transport properties of the polymers.
Group 4: structural units which have combinations of individual units from group 2 and group 3.
Group 5: structural units which influence the morphology and/or emission colour of the resultant polymers.
Group 6: structural units which modify the emission characteristics to such an extent that electrophosphorescence can be obtained instead of electrofluorescence.
Group 7: structural units which improve the transfer from the singlet state to the triplet state.

Suitable and preferred units for the above-mentioned groups are described below, where these preferably contain the fluorine-containing groups defined in accordance with the invention.

Group 1—Structural Units which Represent the Polymer Backbone:

Preferred units from group 1 are, in particular, those which contain aromatic or carbocyclic structures having 6 to 40 C atoms. Suitable and preferred units are, inter alia, fluorene derivatives, as disclosed, for example, in EP 0842208, WO 99/54385, WO 00/22027, WO 00/22026 and WO 00/46321, indenofluorenes, furthermore spirobifluorene derivatives, as disclosed, for example, in EP 0707020, EP 0894107 and WO 03/020790, phenanthrene derivatives or dihydrophenanthrene derivatives, as disclosed, for example, in WO 2005/014689. It is also possible to use a combination of two or more of these monomer units, as described, for example, in WO 02/077060. Besides the units of the formula (I), preferred units for the polymer backbone are, in particular, spirobifluorene, indenofluorene, phenanthrene and dihydrophenanthrene derivatives.

Particularly preferred units from group 1 are divalent units of the following formulae, in which the dashed lines denote the links to the adjacent units:

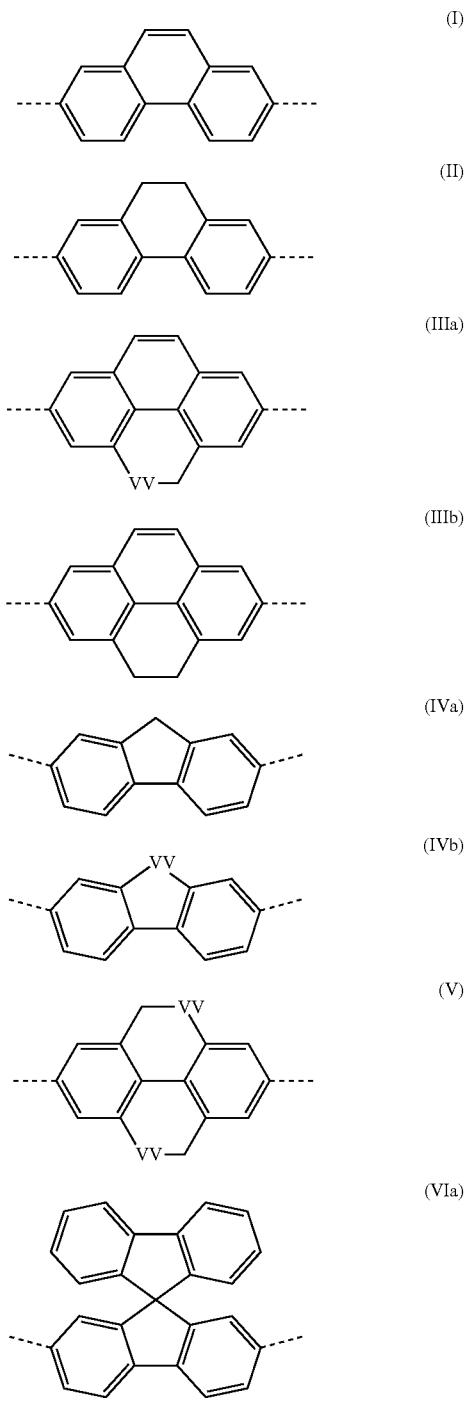

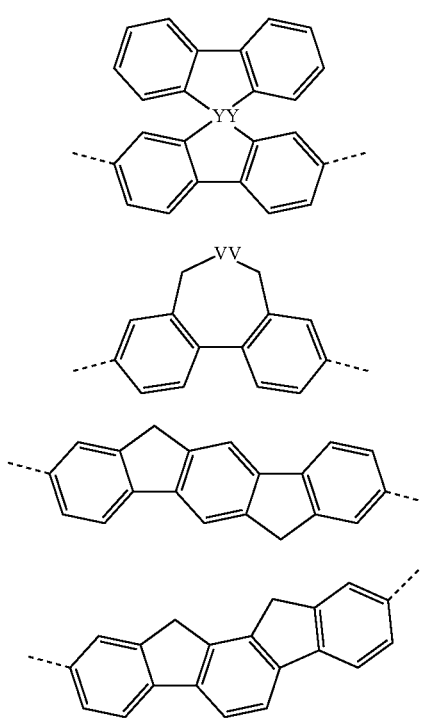

(VIb)

(VII)

(VIII)

(IX)

in which the individual radicals have the following meanings:
YY is Si or Ge,
VV is O, S or Se,
and where the various formulae may also additionally be substituted in the free positions by one or more substituents $R^2$, and $R^2$ has the following meaning:
$R^2$ is on each occurrence, identically or differently, H, a straight-chain, branched or cyclic alkyl or alkoxy chain having 1 to 22 C atoms, in which, in addition, one or more non-adjacent C atoms may be replaced by O, S, CO, O—CO, CO—O or O—CO—O, where, in addition, one or more H atoms may be replaced by fluorine, an aryl or aryloxy group having 5 to 40 C atoms, in which, in addition, one or more C atoms may be replaced by O, S or N and which may also be substituted by one or more non-aromatic radicals $R^2$, or F, CN, $N(R^3)_2$ or $B(R^3)_2$; and
$R^3$ is on each occurrence, identically or differently, H, a straight-chain, branched or cyclic alkyl chain having 1 to 22 C atoms, in which, in addition, one or more non-adjacent C atoms may be replaced by O, S, CO, O—CO, CO—O or O—CO—O, where, in addition, one or more H atoms may be replaced by fluorine, or an optionally substituted aryl group having 5 to 40 C atoms, in which, in addition, one or more C atoms may be replaced by O, S or N.
Group 2—Structural Units which Enhance the Hole-Injection and/or -Transport Properties of the Polymers:
These are generally aromatic amines or electron-rich heterocycles, such as, for example, substituted or unsubstituted triarylamines, benzidines, tetraarylene-para-phenylenediamines, phenothiazines, phenoxazines, dihydrophenazines, thianthrenes, dibenzo-p-dioxins, phenoxathiynes, carbazoles, azulenes, thiophenes, pyrroles, furans and further O-, S- or N-containing heterocycles having a high HOMO (HOMO=highest occupied molecular orbital). However, triarylphosphines, as described, for example, in WO 2005/017065 A1, are also suitable here.

Particularly preferred units from group 2 are divalent units of the following formulae, in which the dashed lines denote the links to the adjacent units:

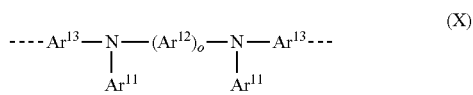

(X)

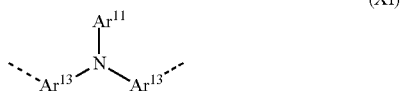

(XI)

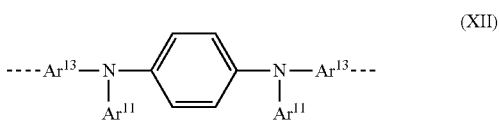

(XII)

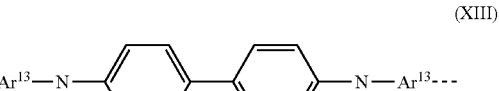

(XIII)

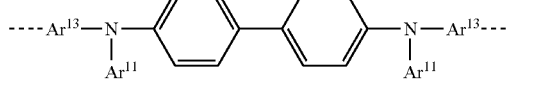

(XIV)

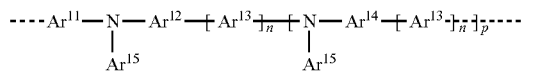

(XV)

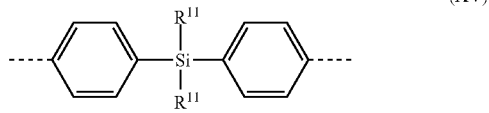

(XVI)

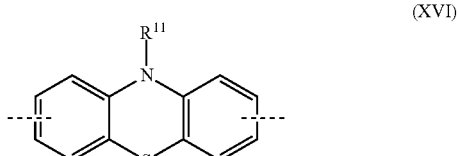

(XVII)

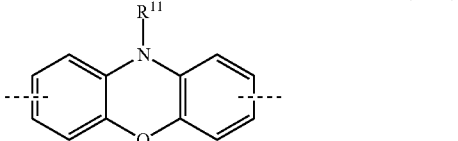

(XVIII)

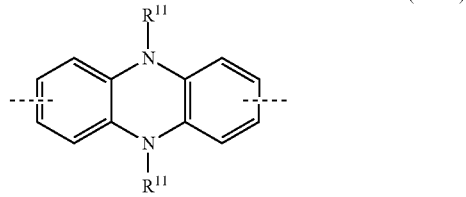

(XIX)

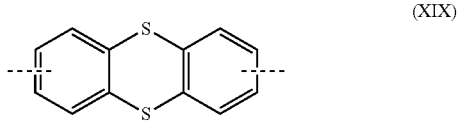

(XX)

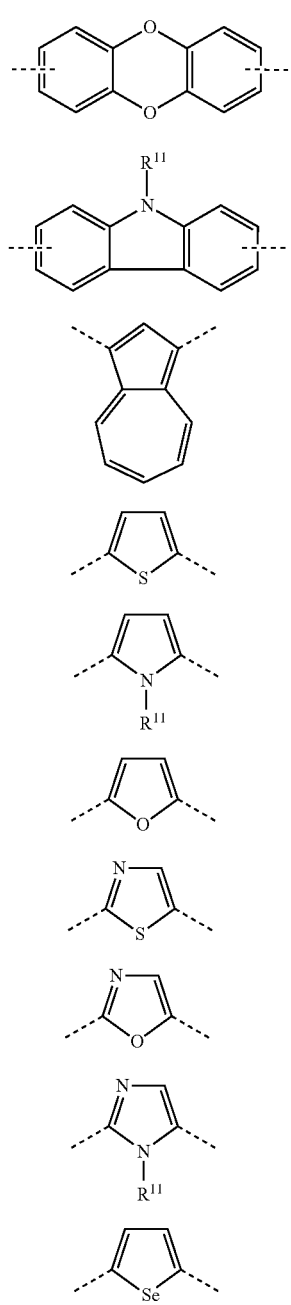

(XXI)
(XXII)
(XXIII)
(XXIV)
(XXV)
(XXVI)
(XXVII)
(XXVIII)
(XXIX)
(XXX)

where $R^{11}$ has one of the meanings indicated above for $R^2$, the various formulae may also additionally be substituted in the free positions by one or more substituents $R^{11}$, and the symbols and indices have the following meanings:

n is, identically or differently on each occurrence, 0, 1 or 2, p is, identically or differently on each occurrence, 0, 1 or 2, preferably 0 or 1, o is, identically or differently on each occurrence, 1, 2 or 3, preferably 1 or 2, $Ar^{11}$, $Ar^{13}$ are on each occurrence, identically or differently, an aromatic or heteroaromatic ring system having 2 to 40 C atoms, which may be mono- or polysubstituted by $R^{11}$ or also unsubstituted; the possible substituents $R^{11}$ here can potentially be in any free position, $Ar^{12}$, $Ar^{14}$ are on each occurrence, identically or differently, $Ar^{11}$, $Ar^{13}$ or a substituted or unsubstituted stilbenzylene or tolanylene unit, $Ar^{15}$ is, identically or differently on each occurrence, either a system as described by $Ar^{11}$ or an aromatic or heteroaromatic ring system having 9 to 40 aromatic atoms (C or heteroatoms), which may be mono- or polysubstituted by $R^{11}$ or unsubstituted and which consists of at least two condensed rings; the possible substituents $R^{11}$ here can potentially be in any free position.

Group 3—Structural Units which Enhance the Electron-Injection and/or -Transport Properties of the Polymers:

These are generally electron-deficient aromatics or heterocycles, such as, for example, substituted or unsubstituted pyridines, pyrimidines, pyridazines, pyrazines, pyrenes, perylenes, anthracenes, benzanthracenes, oxadiazoles, quinolines, quinoxalines, phenazines, benzimidazoles, ketones, phosphine oxides, sulfoxides or triazines, but also compounds such as tri-arylboranes and further O-, S- or N-containing heterocycles having a low LUMO (LUMO=lowest unoccupied molecular orbital), and benzophenones and derivatives thereof, as disclosed, for example, in WO 05/040302.

Particularly preferred units from group 3 are divalent units of the following formulae, in which the dashed lines denote the links to the adjacent units:

(XXXI)

(XXXII)

(XXXIII)

(XXXIV)

(XXXV)

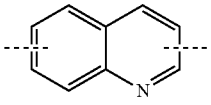

(XXXVI)

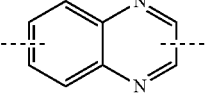

(XXXVII)

(XXXVIIIa)

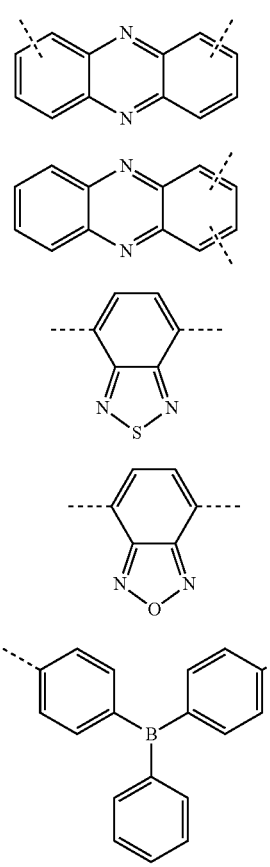

(XXXVIIIb)

(XXXIX)

(XL)

(XLI)

where the various formulae may be substituted in the free positions by one or more substituents $R^{11}$ as defined above.

Group 4—Structural Units which have Combinations of Individual Units from Group 2 and Group 3:

It is also possible for the polymers to contain units in which structures which increase the hole mobility and the electron mobility or both are bonded directly to one another. However, some of these units shift the emission colour into the yellow or red. Their use in the opto-electronic device according to the invention for generating blue or green emission is therefore less preferred.

If such units from group 4 are present in the polymers, they are preferably selected from divalent units of the following formulae, in which the dashed lines denote the links to the adjacent units:

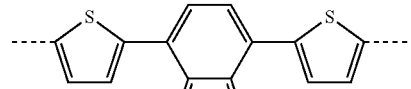

(XLII)

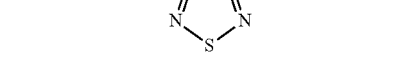

(XLIII)

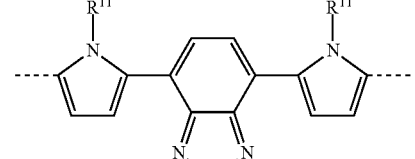

(XLIV)

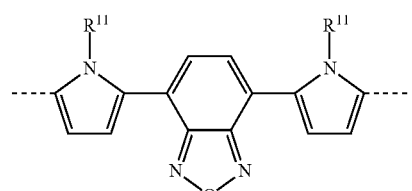

(XLV)

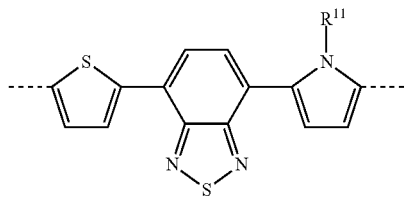

(XLVI)

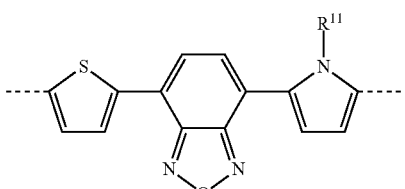

(XLVII)

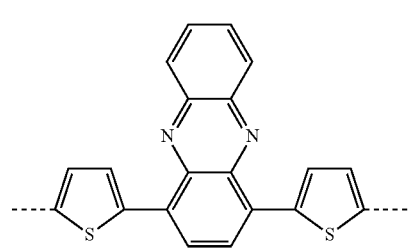

(XLVIII)

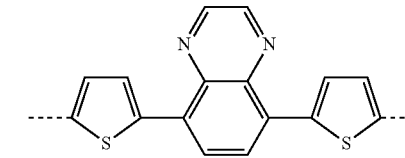

(XLIX)

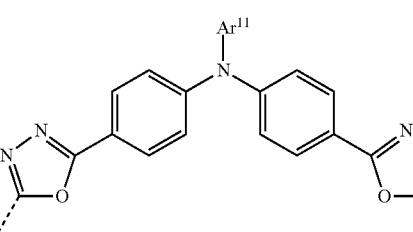

(L)

(LI)

-continued

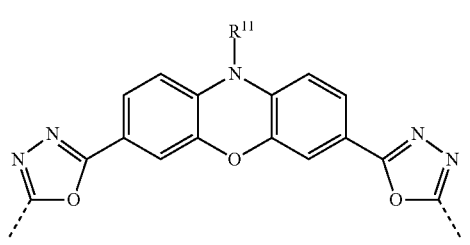
(LII)

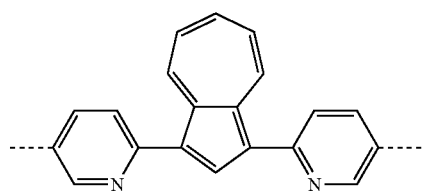
(LIII)

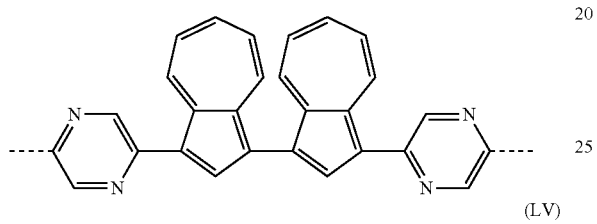
(LIV)

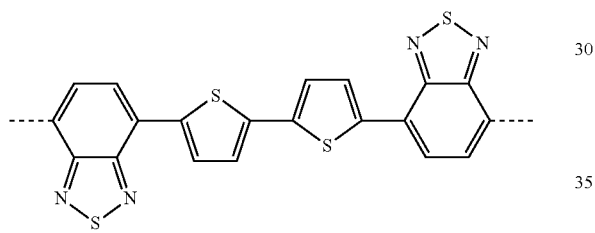
(LV)

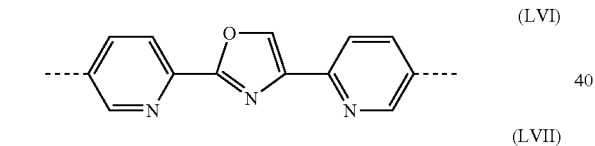
(LVI)

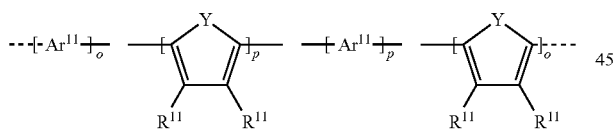
(LVII)

where the various formulae may be substituted in the free positions by one or more substituents $R^{11}$, the symbols $R^{11}$, $Ar^{11}$, p and o have the meanings indicated above, and Y is on each occurrence, identically or differently, O, S, Se, N, P, Si or Ge.

Group 5—Structural Units which Influence the Morphology and/or Emission Colour of the Resultant Polymers:

Besides the units mentioned above, these are those which have at least one further aromatic or another conjugated structure which does not fall under the above-mentioned groups, i.e. which has only little effect on the charge-carrier mobility, which are not organometallic complexes or which have no influence on the singlet-triplet transfer. Structural elements of this type may influence the morphology, but also the emission colour of the resultant polymers. Depending on the unit, they can therefore also be employed as emitters. Preference is given here to substituted or unsubstituted aromatic structures having 6 to 40 C atoms or also tolane, stilbene or bis-styrylarylene derivatives, each of which may be substituted by one or more radicals $R^{11}$. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene or 4,4"-bis-styrylarylene derivatives.

Very particular preference is given to substituted or unsubstituted structures of the following formulae, in which the dashed lines denote the links to the adjacent units:

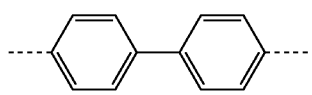
(LVIII)

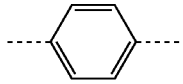
(LIX)

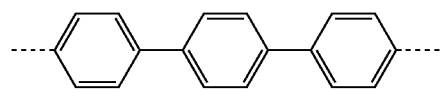
(LX)

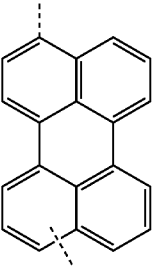
(LXI)

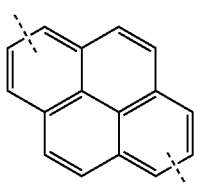
(LXII)

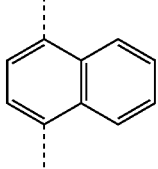
(LXIII)

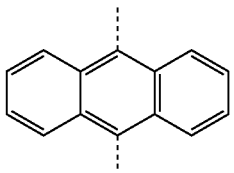
(LXIV)

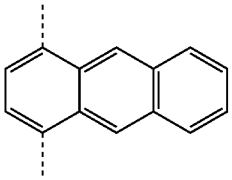
(LXVa)

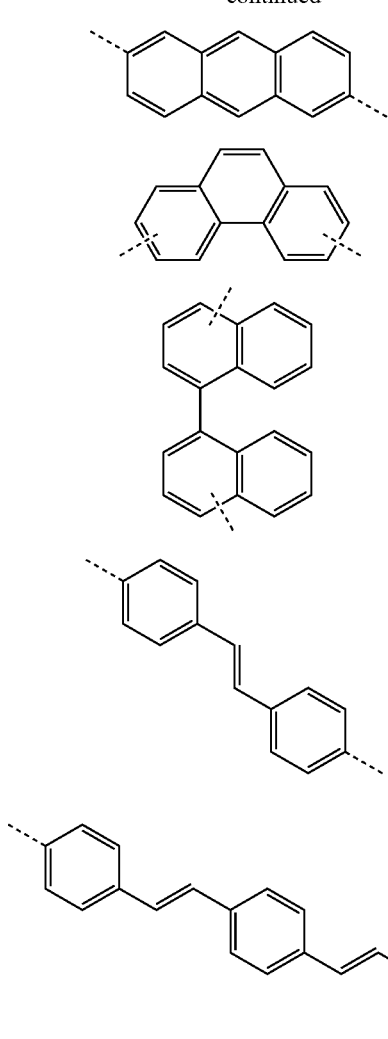

(LXVb)

(LXVI)

(LXVII)

(LXVIII)

(LXIX)

where the various formulae may be substituted in the free positions by one or more substituents $R^{11}$ as defined above.

Group 6—Structural Units which Modify the Emission Characteristics to Such an Extent that Electrophosphorescence can be Obtained Instead of Electrofluorescence:

These are, in particular, those units which are able to emit light from the triplet state with high efficiency even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Particularly suitable compounds are those which contain d- or f-transition metals which satisfy the above-mentioned condition. Very particular preference is given here to corresponding structural units which contain elements from groups 8 to 10 (Ru, Os, Rh, Ir, Pd, Pt). Suitable structural units for the polymers here are, for example, various complexes which are described, for example, in WO 02/068435, WO 02/081488, EP 1239526 and WO 04/026886. Corresponding monomers are described in WO 02/068435 and WO 2005/042548 A1.

Preferred units from group 6 are those of the following formulae, in which the dashed lines denote the links to the adjacent units:

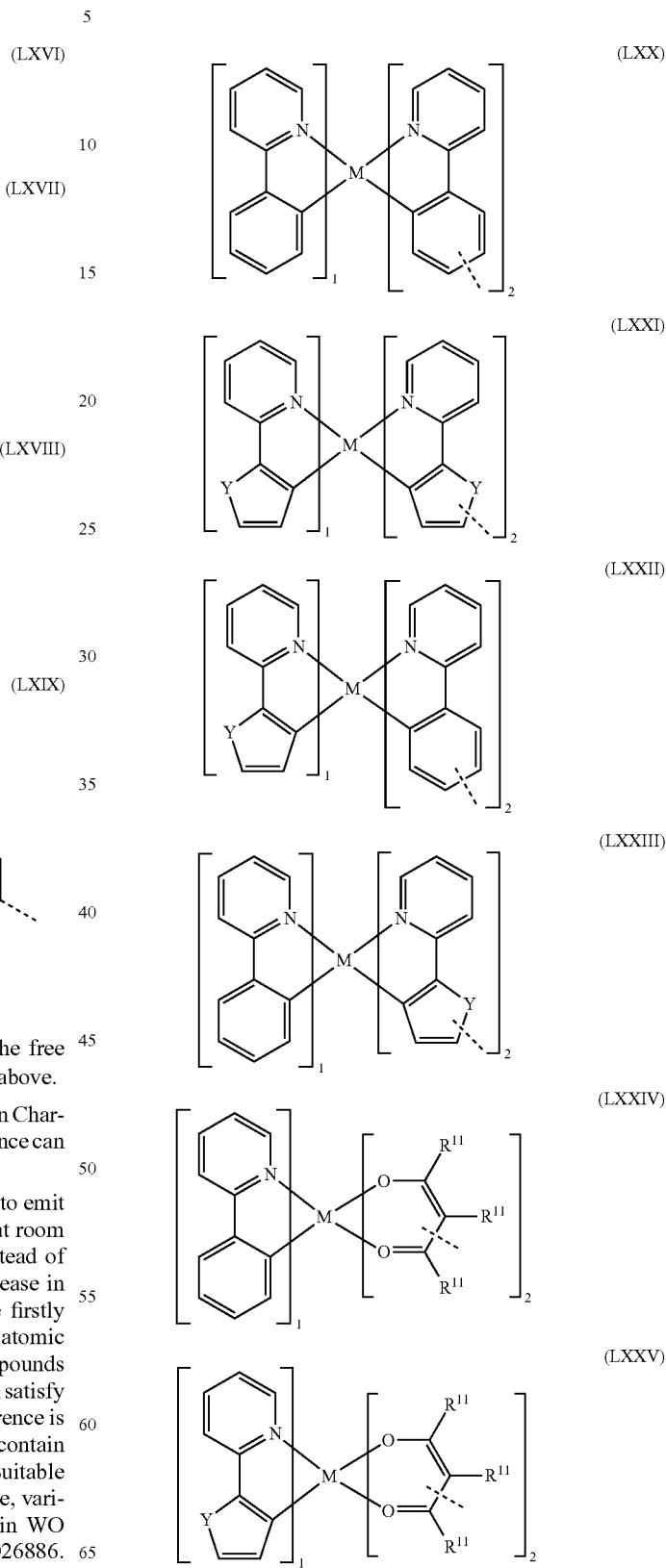

(LXX)

(LXXI)

(LXXII)

(LXXIII)

(LXXIV)

(LXXV)

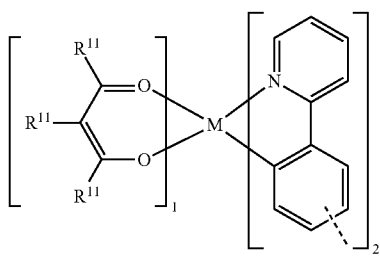
(LXXVI)

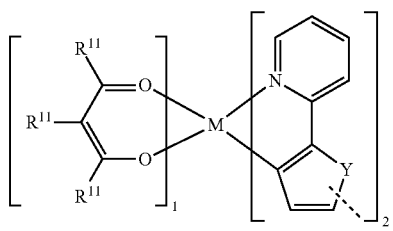
(LXXVII)

in which M stands for Rh or Ir, Y has the above-mentioned meaning, and the various formulae may be substituted in the free positions by one or more substituents $R^{11}$ as defined above.

Group 7—Structural Units which Improve the Transfer from the Singlet State to the Triplet State:

These are, in particular, those units which improve the transfer from the singlet state to the triplet state and which, employed in support of the structural elements from group 6, improve the phosphorescence properties of these structural elements. Suitable for this purpose are, in particular, carbazole and bridged carbazole dimer units, as described, for example, in WO 04/070772 and WO 04/113468. Also suitable for this purpose are ketones, phosphine oxides, sulfoxides and similar compounds, as described, for example, in WO 2005/040302 A1.

It is also possible for more than one structural unit from one of groups 1 to 7 to be present simultaneously.

The polymer may furthermore likewise contain metal complexes, which are generally built up from one or more ligands and one or more metal centres, bonded into the main or side chain.

Preference is given to polymers which additionally also contain one or more units selected from groups 1 to 7.

It is likewise preferred for the polymers to contain units which improve the charge transport or charge injection, i.e. units from group 2 and/or 3; a proportion of 1 to 30 mol % of these units is particularly preferred; a proportion of 2 to 10 mol % of these units is very particularly preferred.

It is furthermore particularly preferred for the polymers to contain units from group 1, units from group 2 and/or 3, and units from group 5.

The polymers preferably contain 10 to 10,000, particularly preferably 20 to 5000 and in particular 50 to 2000, recurring units. A distinction should be made between these and the fluorinated oligomers according to the invention, which contain 3 to 9 recurring units. Otherwise, the oligomers may also contain all recurring units defined above, including the emitters.

The requisite solubility of the polymers is ensured, in particular, by the substituents on the various recurring units.

The polymers may be linear, branched or crosslinked. The copolymers according to the invention may have random, alternating or block-like structures or also have a plurality of these structures in an alternating arrangement. The way in which copolymers having block-like structures can be obtained and which further structural elements are particularly preferred for this purpose are described in detail, for example, in WO 2005/014688. This specification is incorporated into the present application by way of reference.

The polymers are generally prepared by polymerisation of one or more types of monomer. Suitable polymerisation reactions are known to the person skilled in the art and are described in the literature. Particularly suitable and preferred polymerisation and coupling reactions, all of which result in C—C links, are the SUZUKI, YAMAMOTO, STILLE, HECK, NEGISHI, SONOGASHIRA or HIYAMA reactions.

The way in which the polymerisation can be carried out by these methods and the way in which the polymers can then be separated off from the reaction medium and purified are known to the person skilled in the art and are described in detail in the literature, for example in WO 2003/048225 and WO 2004/037887.

The C—C linking reactions are preferably selected from the groups of the SUZUKI coupling, the YAMAMOTO coupling and the STILLE coupling.

For the synthesis of the polymers, the corresponding monomers are required. The synthesis of units from groups 1 to 7 is known to the person skilled in the art and is described in the literature, for example in WO 2005/014689. This and the literature cited therein are incorporated into the present application by way of reference.

It may additionally be preferred to use the polymer not as the pure substance, but instead as a mixture (blend) together with further polymeric, oligomeric, dendritic or low-molecular-weight substances of any desired type. These may, for example, improve the electronic properties or emit themselves. The present invention therefore also relates to blends of this type.

The invention furthermore relates to solutions and formulations comprising one or more fluorine-containing polymers and/or fluorine-containing blends and/or fluorinated small molecules in accordance with the invention (as defined above) in one or more solvents. The way in which polymer solutions or solutions of small molecules can be prepared is known to the person skilled in the art and is described, for example, in WO 02/072714, WO 03/019694 and the literature cited therein. The solutions and formulations may optionally comprise one or more additives.

These solutions can be used in order to produce thin polymer layers, for example by area-coating methods (for example spin coating) or by printing processes (for example ink-jet printing), in particular in the process according to the invention.

The invention also relates to a process for the production of an opto-electronic device, comprising
 a) application of a first layer to a substrate, and
 b) application of a second layer,
where the first layer is an electrode which is provided with fluorine-containing groups before, during or after application to the substrate.

In a preferred embodiment, the electrode used is indium tin oxide (ITO) or indium zinc oxide (IZO). In this case, the fluorine-containing groups are applied to the electrode via a surface reaction or $CF_4$ plasma treatment after application of the electrode to the substrate. Various fluorine-containing groups, for example $CF_3$, or even individual fluorine atoms which bond to the ITO or IZO surface are thereby formed on the surface of the electrode.

The substrate used in accordance with the invention is glass or a polymer film, preferably glass.

In a further preferred embodiment, the electrode is a highly conductive polymer or a two-layer electrode consisting of ITO/IZO and a conductive polymer, and the fluorine-containing groups are introduced into the conductive polymer before application of the electrode to the substrate.

The conductive polymer used is preferably one of the conjugated polymers PEDOT or PANI defined above, which are preferably provided with fluorine-containing groups. In the case of a conductive polymer, the fluorination is carried out by methods in accordance with the prior art, for example by polymerising fluorinated monomers or by fluorinating the finished polymer. The component containing fluorine-containing groups is preferably a partially fluorinated polymer or a polymer containing fluorinated or perfluorinated side groups, an oligomer containing fluorinated groups, a fluorinated molecule, or combinations thereof. Particular preference is given to the use of the doping species as fluorine carrier (i.e., for example, fluorinated polystyrenesulfonic acid).

The second layer is preferably applied by coating from a solution containing the polymer, for example by spin coating or knife coating. For the second layer, a partially fluorinated polymer, a polymer containing perfluorinated side groups, an oligomer containing fluorinated groups or a fluorinated molecule is used. It is furthermore preferred for the second layer to have a charge-injection function, an emitter function, a barrier function or combinations of the said functions. To this end, it is possible, for example, to employ a conjugated polymer defined above which has the corresponding functions or to employ corresponding oligomers or molecules. The emitters defined above can likewise be employed in the process according to the invention.

One or more additional layers can now be applied to the applied layer without the fixed layer being dissolved or swelling. The fluorine-containing groups of the preceding layer and the fluorine-containing groups of the applied layer align in such a way here that an adhesive fluorine-fluorine interaction occurs, which, after removal of the solvent, guarantees such strong adhesion of the applied layer to the preceding layer that particularly good contact is established. In this way, a plurality of layers which function, for example, as hole-injection layers or electron-barrier layers can be deposited with good adhesion, and these layers can be optimised for suitable colour and efficiency of the device. In addition, the lifetime of a layer of this type can be increased by an improved electron-barrier function (fewer tunnel effects in the underlying layer, in particular the case for PEDOT).

When all the additional layers have been applied successively, a cathode is furthermore applied by methods known from the prior art. Finally, an encapsulation is applied in order to protect the device against external influences, such as water vapour, oxygen and the like.

The invention will now be explained in greater detail with reference to some illustrative embodiments, which are not to be regarded as restricting the scope of the invention, with reference to the figures.

WORKING EXAMPLES

Example 1

Production of the Device According to the Invention

Step a) Modification of the Indium Tin Oxide Layer

Prefabricated full-area ITO was purchased from Technoprint. The ITO layer thickness was 160 nm. The ITO substrates were pre-cleaned (using deionised water and Deconex), dried and transferred into a plasma oven, where the ITO layer was fluorinated by a $CF_4$ plasma treatment (PS 400 Microwave Plasma System from PVA TePla America Inc., pressure 0.4 mbar, $CF_4$ flow rate 200 ml/min, 1000 watts, 5 min).

Fluorination of this type generally reduces the surface tension of the ITO, which should make adhesion of a further layer to be deposited more difficult.

Step b) Application of a Layer of a Conductive Fluorinated Polymer

A film of a fluorinated polyaniline (PANI) was applied to the modified ITO layer by spin coating from aqueous dispersion (PBM-001; Merck KGaA). After application of the film, the latter was dried by heating at 180° C. for 10 minutes.

A homogeneous film was obtained (layer thickness: 70 nm), which could not be washed off again by treatment with solvents, i.e. adhered very well to the fluorinated ITO surface in spite of the latter. This is attributable to the fluorine-fluorine interaction at the interface, which surprisingly results in good adhesion, which results in improved and more homogeneous charge injection from the anode to the polymer in an OLED built up therefrom.

FIG. 1 shows the structure according to the invention, in which a fluorinated ITO layer has been coated with a fluorinated polymer.

Instead of the conductive, fluorinated polyaniline (PANI), it is also possible to employ all other conductive polymers (such as, for example, PEDOT/PSSH) which are either commercially available in fluorinated form or can subsequently be fluorinated by processes known to the person skilled in the art.

The layer structure obtained in step b) was used further in Example 2.

Comparative Example 2

The modification of the indium tin oxide layer (step a) was carried out as in Example 1.
Step b) Application of a Layer of a Conductive Unfluorinated Polymer A film of a unfluorinated polyaniline (PANI) was applied to the modified ITO layer by spin coating from aqueous dispersion (PAT020; Merck KGaA). After application of the film, the latter was dried by heating at 180° C. for 10 minutes.

A continuous film was not obtained.

Example 3

The layer structure obtained in Example 1 was coated with a further layer of a fluorinated polymer by spin coating.

The polymer used for this purpose was a polymer (P1) having hole-injecting properties which was synthesised using the following monomers (percentage data=mol %) by SUZUKI coupling in accordance with WO 03/048225 A2.

Polymer P1:

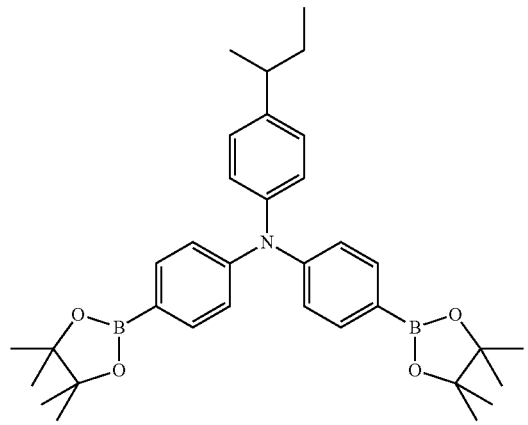

50%

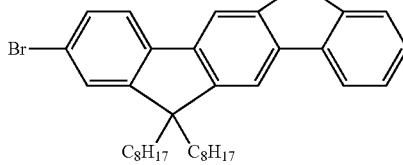

45%

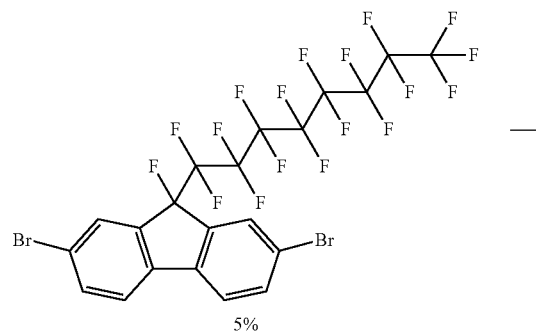

5%

Pol

Figure 2:
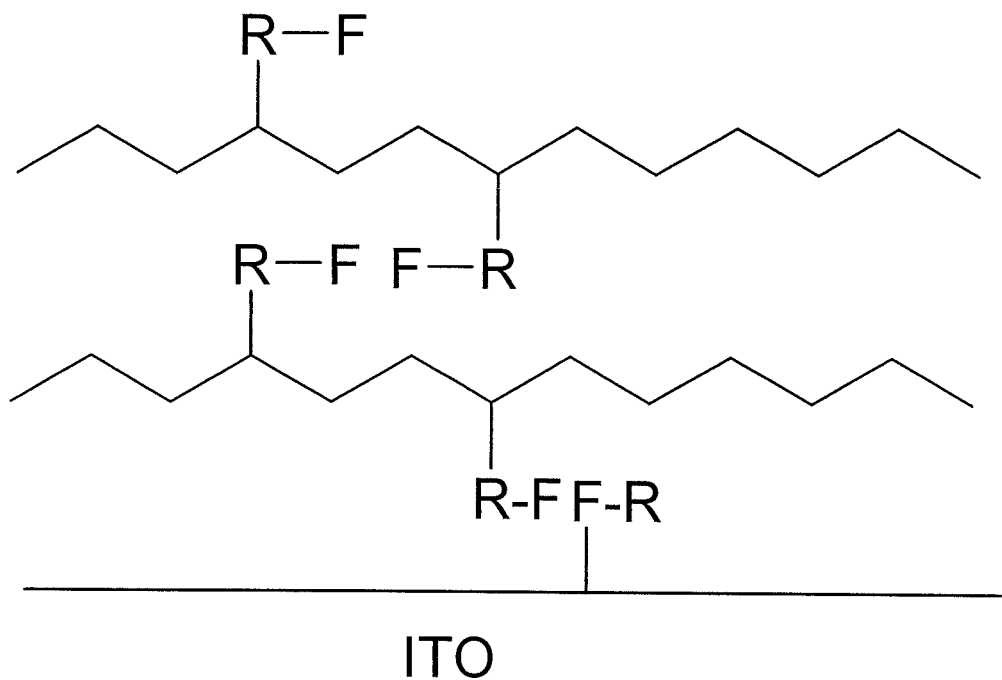

FIG. 2 shows the structure according to the invention, in which the layer structure produced in Example 1 has been coated with a further layer of a fluorinated polymer by spin coating.

Comparative Example 4

The layer structure obtained in Example 1 was coated with a further layer of a non-fluorinated polymer by spin coating.

The polymer used for this purpose was a polymer (C1) having hole-injecting properties which was synthesised analogously to Example 3 using the following monomers (percentage data=mol %).

Comparative polymer C1:

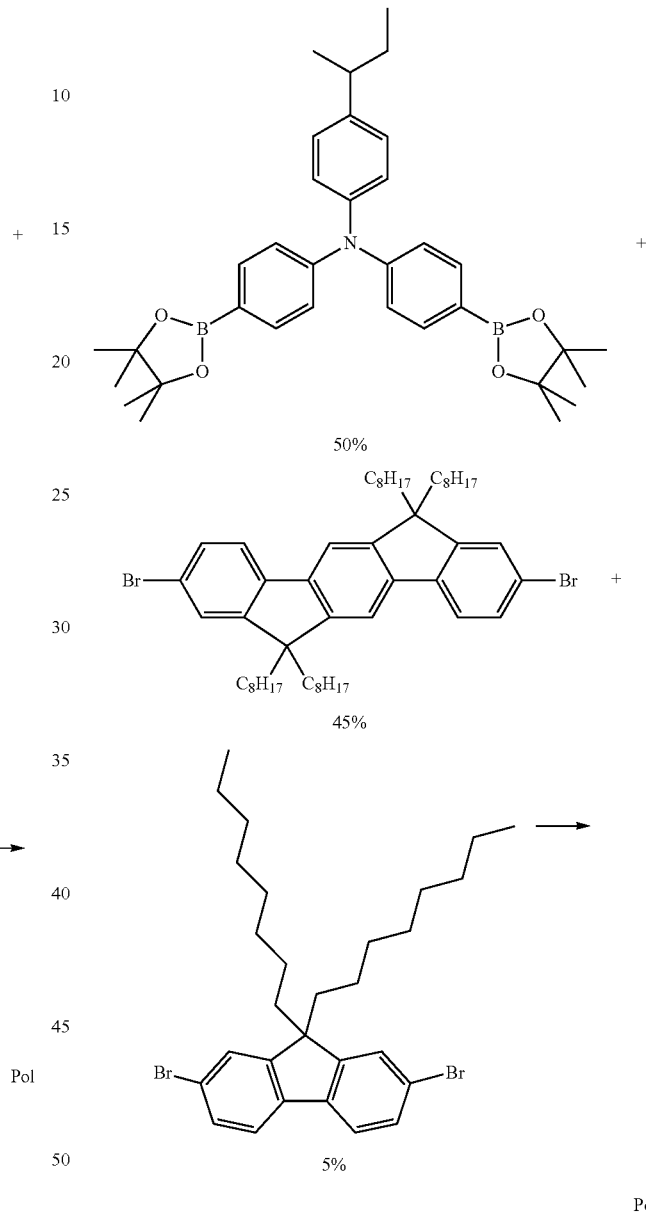

Comparative Example 5

The layer structure obtained in Example 1 was coated with a further layer of a non-fluorinated polymer by spin coating.

The polymer used for this purpose was a polymer (C2) having hole-injecting properties which was synthesised analogously to Example 3 using the following monomers (percentage data=mol %).

Comparative polymer C2:

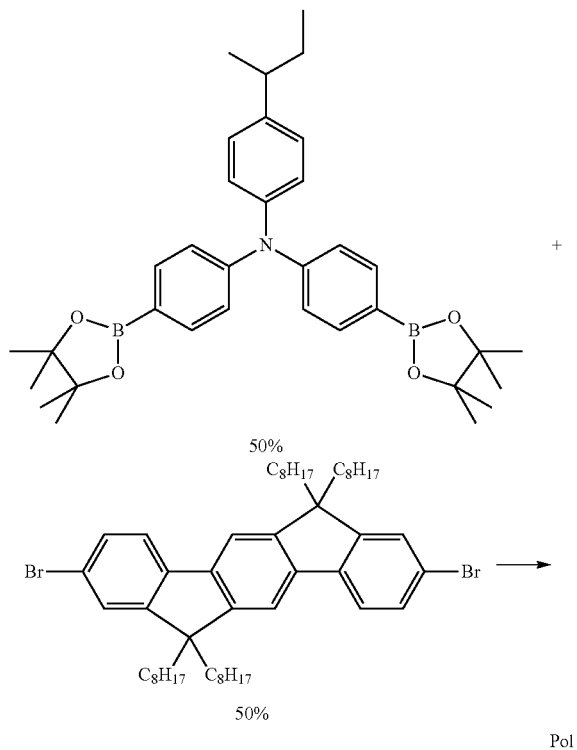

In order to investigate film formation and adhesion of the polymers, photographs were taken of the films applied by spin coating with P1, C1 and C2 from toluene (concentration 5 mg/ml) (dried by heating at 180° C. for 10 minutes), and the layer thickness was measured. The substrate used was in each case the layer produced in accordance with Example 1. In order to increase the contrast of the photographs, the films were placed under a UV lamp.

Figure 3:
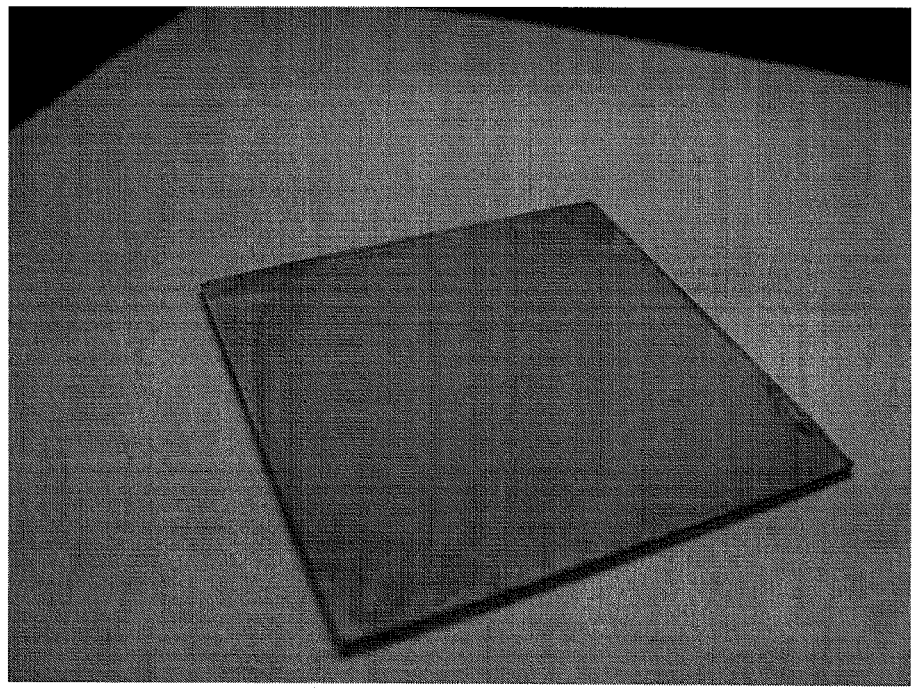

For polymer P1, a homogeneous, continuous layer with a layer thickness of 15 nm was obtained. The uppermost layer from Example 1 was not attacked or swollen here. The layer thicknesses were additive and were evident as steps in the measurement on the profilometer (Dektak ST3 from Veeco Instruments) (from Example 1: 70 nm, layer P1: 15 nm). The film formation of polymer P1 is depicted in FIG. 3.

Figure 4:
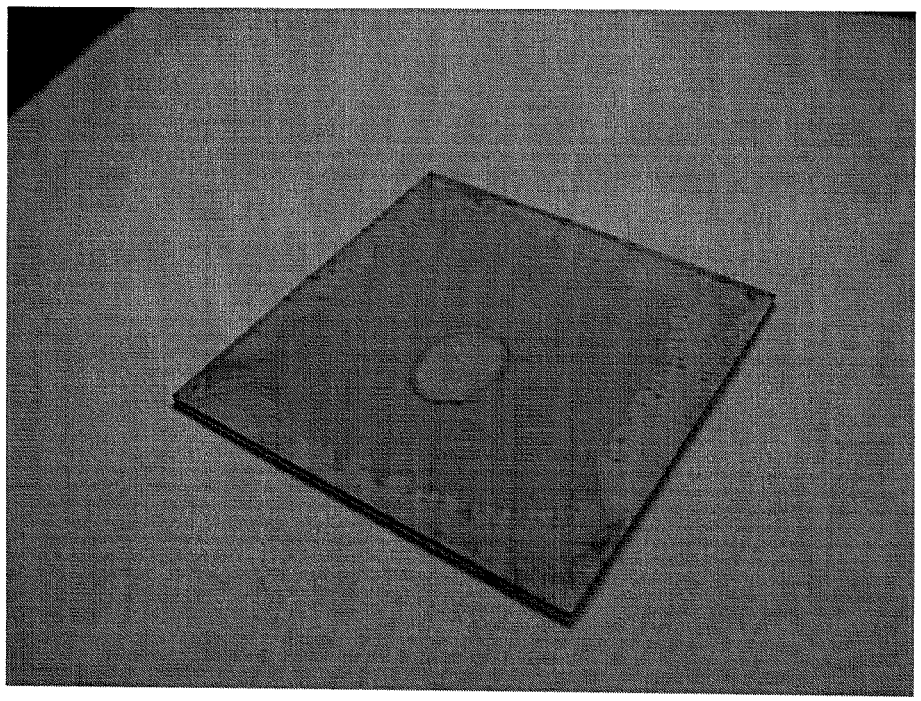
Figure 5:
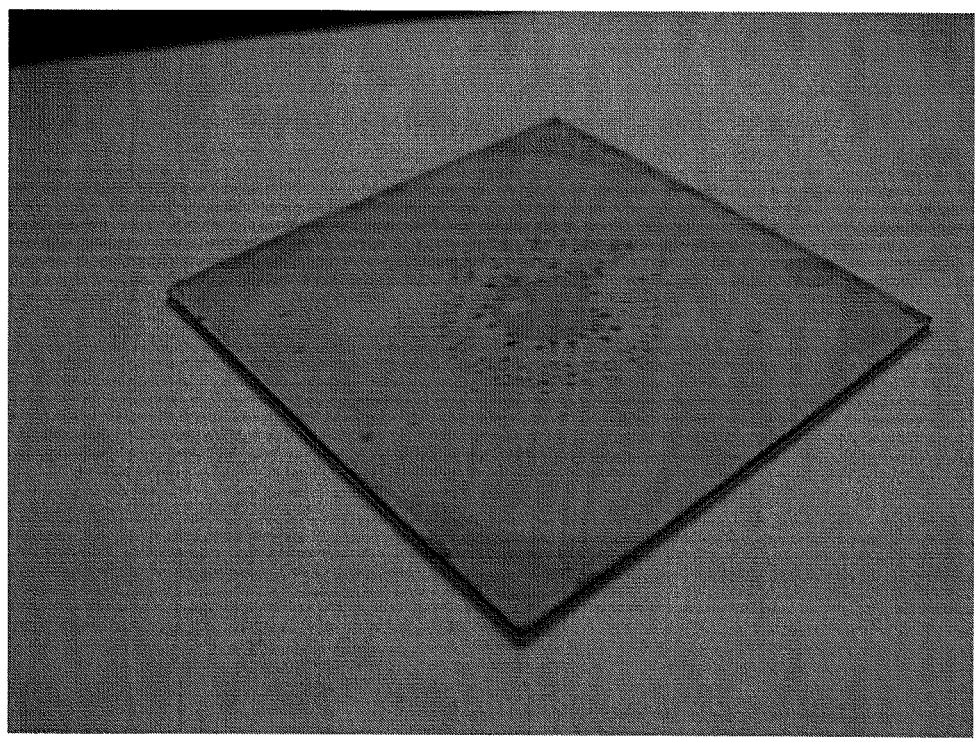

In the case of the two non-fluorinated polymers C1 and C2, a homogeneous film was not obtained in spite of the spin-coating process, which is actually homogenising. Layer-thickness measurements are therefore not meaningful here. The film formation of comparative polymers C1 and C2 is depicted in FIGS. 4 and 5.

Further layers can be applied to the layer structure from Example 2. These layers can comprise all known and suitable materials and be applied by all processes known to the person skilled in the art. It is also possible here for further layers comprising fluorine-containing polymers which are each able to interact with the preceding layers via the fluorine atoms located on the surface to be applied analogously to Example 2.

The invention claimed is:

1. Opto-electronic device comprising on a substrate a first layer and a second layer and at least one additional layer, wherein the first layer comprises an electrode material containing fluorine-containing groups, the second layer comprises a polymer containing fluorine-containing groups, the additional layer comprises compounds containing fluorine-containing groups, where an adhesive fluorine-fluorine interaction exists between some of the fluorine-containing groups of the first layer and of the second layer and between some of the fluorine-containing groups of the additional layer and of the respective preceding layer.

2. Opto-electronic device according to claim 1, characterised in that the first layer is an indium tin oxide (ITO) layer or an indium zinc oxide (IZO) layer.

3. Opto-electronic device according to claim 2, wherein the second layer comprises a conductive polymer.

4. Opto-electronic device according to claim 3, wherein the conductive polymer is PEDOT or PANI.

5. Opto-electronic device according to claim 1, characterised in that the second layer comprises a conductive polymer.

6. Opto-electronic device according to claim 5, characterised in that the conductive polymer is PEDOT or PANI.

7. Opto-electronic device according to claim 1, characterised in that the first layer is a layer of a conductive polymer.

8. Opto-electronic device according to claim 1, characterised in that the second layer comprises a charge-injection function, a charge-transport function and/or an emitter function.

9. Opto-electronic device according to claim 1, characterised in that the additional layer comprises a polymer containing fluorine-containing groups, a partially fluorinated polymer or a polymer containing fluorinated or perfluorinated side groups, an oligomer containing fluorinated groups or a fluorinated molecule.

10. Opto-electronic device according to claim 1, characterised in that the additional layer comprises a charge-injection function, an emitter function, a barrier function and/or a combination thereof.

11. Opto-electronic device according to claim 1, characterised in that the device comprises a polymer having an emitter function.

12. Opto-electronic device according to claim 11, characterised in that the polymer having an emitter function emits light of various wavelengths.

13. Opto-electronic device according to claim 12, characterised in that the various light wavelengths add up to the colour white.

14. Opto-electronic device according to claim 12, characterised in that the device comprises three layers having the primary colours red, green and blue.

15. Opto-electronic device according to claim 12, characterised in that at least one of the layers comprises singlet emitters, but at least one of the other layers comprises triplet emitters.

16. An article which comprises the opto-electronic device according to claim 12 wherein the article is an organic or polymeric light-emitting diode, an organic solar cell, an organic field-effect transistor, an organic integrated circuit, an organic field-quench element, an organic optical amplifier, an organic laser diode, an organic photoreceptor or an organic photodiode.

17. The article according to claim 16 wherein the article is a organic light emitting diode in a display, in a coloured, multi-coloured or full-colour display, as lighting element or as backlight in a liquid-crystal display (LCD).

18. The article according to claim 17, characterised in that the OLED is a white light-emitting OLED.

19. Opto-electronic device according to claim 1, characterised in that the device comprises a plurality of layers of polymers having an emitter function.

20. Opto-electronic device according to claim 19, characterised in that the plurality of layers of polymers having an emitter function each emit light of different wavelength.

21. Opto-electronic device according to claim 1, characterised in that the device comprises a plurality of layers of polymers having a hole-conductor function, where the hole conductors have energetically different highest occupied molecular orbitals (HOMO).

22. Opto-electronic device according to claim 21, characterised in that the polymer layer having a hole-conductor function which was applied last has an energetically high lowest unoccupied molecular orbital (LUMO).

23. Opto-electronic device according to claim 22, characterised in that the polymer layer having a hole-conductor function which was applied last is an electron-blocking layer.

24. Opto-electronic device according to claim 1, characterised in that the device comprises a plurality of layers of polymers having an electron-conductor function, where the electron conductors have energetically different lowest unoccupied molecular orbitals (LUMO).

25. Opto-electronic device according to claim 24, characterised in that the polymer layer having an electron-conductor function which was applied first has an energetically low highest occupied molecular orbital (HOMO).

26. Opto-electronic device according to claim 25, characterised in that the polymer layer having an electron-conductor function which was applied first is a hole-blocking layer.

27. Opto-electronic device according to claim 1, furthermore comprising a cathode.

28. Opto-electronic device according to claim 1, furthermore comprising an encapsulation.

29. Opto-electronic device comprising a first layer and a second layer on a substrate, wherein the first layer comprises an electrode material containing fluorine-containing groups and the second layer comprises a polymer containing fluorine-containing groups, where an adhesive fluorine-fluorine interaction exists between some of the fluorine-containing groups of the first layer and of the second layer and wherein one of the following exists,
 a) at least one of the layers comprises singlet emitters, but at least one of the other layers comprises triplet emitters,
 b) the device comprises a plurality of layers of polymers having a hole-conductor function, where the hole conductors have energetically different highest occupied molecular orbitals (HOMO),
 c) the device comprises a plurality of layers of polymers having an electron-conductor function, where the electron conductors have energetically different lowest unoccupied molecular orbitals (LUMO),
 d) which further comprises a cathode, or
 e) further comprises an encapsulation.

* * * * *